(12) United States Patent
Kronholz et al.

(10) Patent No.: US 8,772,843 B2
(45) Date of Patent: Jul. 8, 2014

(54) OXIDE DEPOSITION BY USING A DOUBLE LINER APPROACH FOR REDUCING PATTERN DENSITY DEPENDENCE IN SOPHISTICATED SEMICONDUCTOR DEVICES

(75) Inventors: Stephan Kronholz, Dresden (DE); Markus Lenski, Dresden (DE); Kerstin Ruttloff, Hainichen (DE); Volker Jaschke, Radebeul (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 73 days.

(21) Appl. No.: 13/183,549

(22) Filed: Jul. 15, 2011

(65) Prior Publication Data

US 2012/0049296 A1 Mar. 1, 2012

(30) Foreign Application Priority Data

Aug. 31, 2010 (DE) .......................... 10 2010 040 060

(51) Int. Cl.
| | |
|---|---|
| H01L 29/76 | (2006.01) |
| H01L 21/02 | (2006.01) |
| H01L 21/31 | (2006.01) |
| H01L 21/461 | (2006.01) |
| H01L 21/8238 | (2006.01) |
| H01L 29/66 | (2006.01) |
| H01L 29/78 | (2006.01) |

(52) U.S. Cl.
CPC *H01L 21/823807* (2013.01); *H01L 21/823814* (2013.01); H01L 21/02126 (2013.01); *H01L 21/823871* (2013.01); H01L 21/022 (2013.01); H01L 21/02164 (2013.01); H01L 21/02274 (2013.01); H01L 29/6656 (2013.01); *H01L 21/823864* (2013.01); H01L 29/7848 (2013.01); H01L 29/66636 (2013.01)
USPC ............ 257/288; 257/408; 438/703; 438/719

(58) Field of Classification Search
None
See application file for complete search history.

(56) References Cited

U.S. PATENT DOCUMENTS

| | | | |
|---|---|---|---|
| 6,451,704 B1 * | 9/2002 | Pradeep et al. ................ | 438/719 |
| 2002/0076947 A1 | 6/2002 | Li et al. | |
| 2004/0146661 A1 | 7/2004 | Kapoor et al. | |
| 2005/0133876 A1 * | 6/2005 | Bu et al. ......................... | 257/408 |
| 2005/0136688 A1 * | 6/2005 | Yoo ................................. | 438/783 |
| 2005/0202686 A1 * | 9/2005 | Saki et al. ...................... | 438/783 |
| 2008/0164491 A1 | 7/2008 | Liu et al. | |
| 2010/0025742 A1 * | 2/2010 | Beyer et al. .................... | 257/288 |
| 2010/0084277 A1 * | 4/2010 | Park et al. ....................... | 205/95 |
| 2010/0197124 A1 | 8/2010 | Jeong et al. | |

OTHER PUBLICATIONS

Translation of Official Communication from German Patent Application No. 10 2010 040 060.2 dated Apr. 29, 2011.

* cited by examiner

*Primary Examiner* — Fernando L Toledo
*Assistant Examiner* — Valerie N Newton
(74) *Attorney, Agent, or Firm* — Amerson Law Firm, PLLC (57) ABSTRACT

A silicon dioxide material may be provided in sophisticated semiconductor devices in the form of a double liner including an undoped silicon dioxide material in combination with a high density plasma silicon dioxide, thereby providing reduced dependency on pattern density. In some illustrative embodiments, the silicon dioxide double liner may be used as a spacer material and as a hard mask material in process strategies for incorporating a strain-inducing semiconductor material.

30 Claims, 4 Drawing Sheets

OXIDE DEPOSITION BY USING A DOUBLE LINER APPROACH FOR REDUCING PATTERN DENSITY DEPENDENCE IN SOPHISTICATED SEMICONDUCTOR DEVICES

BACKGROUND OF THE INVENTION

1. Field of the Invention

Generally, the present disclosure relates to the fabrication of highly sophisticated integrated circuits requiring the deposition of silicon oxide materials with superior across-substrate uniformity, and particularly relates to semiconductor devices including transistor elements that comprise a high-k metal gate electrode structure in combination with an embedded strain-inducing semiconductor alloy.

2. Description of the Related Art

The fabrication of advanced integrated circuits, such as CPUs, storage devices, ASICs (application specific integrated circuits) and the like, requires the deposition and patterning of dielectric, semiconductive and conductive materials in order to form circuit elements on a given chip area according to a specified circuit layout. In many complex semiconductor devices, in addition to the many complex processes, frequently silicon dioxide, which is a well-established dielectric material in semiconductor devices, has to be deposited with very uniform characteristics across the semiconductor die and also across the entire substrate in order to ensure uniform performance of individual circuit elements, such as field effect transistors, which represent one important type of circuit element in complex integrated circuits. In recent developments of advanced MOS technologies, which is one of the most promising approaches for forming highly complex circuits due to the superior characteristics in view of operating speed and/or power consumption and/or cost efficiency, performance of field effect transistors is improved by applying highly complex mechanisms, which may require very uniform oxide layers. For example, during the fabrication of complex integrated circuits using MOS technology, millions of transistors, e.g., N-channel transistors and/or P-channel transistors are formed on the substrate that includes a crystalline semiconductor layer. A field effect transistor, irrespective of whether an N-channel transistor or a P-channel transistor is considered, typically comprises so-called PN junctions, i.e., an interface formed by highly doped regions, referred to as drain and source regions, with an inversely doped region, such as a channel region, disposed adjacent to the highly doped regions. In a field effect transistor, the conductivity of the channel region, i.e., the drive current capability of the conductive channel, is controlled by a gate electrode formed adjacent to the channel region and separated therefrom by a thin insulating layer. The conductivity of the channel region, upon formation of a conductive channel due to the application of an appropriate control voltage to the gate electrode, depends on, among other things, the dopant concentration, the mobility of the charge carriers and, for a planar transistor architecture, the distance between the source and drain regions, which is also referred to as channel length.

Presently, the greater part of integrated circuits are formed on the basis of silicon due to its substantially unlimited availability, the well-understood characteristics of silicon and related materials and processes and the experience gathered during the past 50 years. Therefore, silicon will likely remain the material of choice for future circuit generations designed for mass products. One reason for the importance of silicon in fabricating semiconductor devices has been the superior characteristics of a silicon/silicon dioxide interface that allows reliable electrical insulation of different silicon regions from each other. The silicon/silicon dioxide interface is stable at high temperatures and, thus, allows performing subsequent high temperature processes, as are required, for example, for anneal cycles to activate dopants and to cure crystal damage without sacrificing the electrical characteristics of the interface.

For the reasons pointed out above, in field effect transistors, silicon dioxide has been preferably used as a base material for gate insulation layers that separate the gate electrode, frequently comprised of polysilicon, from the silicon channel region. In steadily improving device performance of field effect transistors, the length of the channel region has been continuously decreased to improve switching speed and drive current capability. Since the transistor performance is controlled by, among other things, the voltage supplied to the gate electrode to invert the surface of the channel region to a sufficiently high charge density for providing the desired drive current for a given supply voltage, a certain degree of capacitive coupling, provided by the capacitor formed by the gate electrode, the channel region and the silicon dioxide disposed therebetween, has to be maintained. It turns out that decreasing the channel length for a planar transistor configuration requires an increased capacitive coupling, in combination with sophisticated lateral and vertical dopant profiles in the drain and source regions to avoid the so-called short channel behavior during transistor operation. The short channel behavior may lead to an increased leakage current and to a pronounced dependence of the threshold voltage on the channel length. Aggressively scaled planar transistor devices with a relatively low supply voltage and thus reduced threshold voltage may suffer from an exponential increase of the leakage current due to the required enhanced capacitive coupling of the gate electrode to the channel region. That is, conventionally, the thickness of the silicon dioxide layer has been correspondingly reduced to provide the required capacitance between the gate and the channel region. For example, a channel length of approximately 0.08 μm may require a gate dielectric made of silicon dioxide as thin as approximately 1.2 nm. Therefore, the relatively high leakage current caused by the direct tunneling of charge carriers through an ultra-thin silicon dioxide gate insulation layer may reach values for an oxide thickness in the range of 1-2 nm that may no longer be compatible with requirements for many types of circuits.

For this reason, new strategies have been developed in overcoming the limitations imposed by high leakage currents of extremely thin silicon oxide-based gate insulation layers. One very promising approach is the replacement of the conventional dielectric materials, at least partially, by dielectric materials having a dielectric constant that is significantly greater than the dielectric constant of silicon dioxide-based materials. For example, dielectric materials, also referred to as high-k dielectric materials, with a dielectric constant of 10.0 and significantly higher, may be used, for instance in the form of hafnium oxide, zirconium oxide and the like. In addition to providing a high-k dielectric material in the gate insulation layers, appropriate metal-containing materials may also have to be incorporated since the required work function values for P-channel transistors and N-channel transistors may not be obtained on the basis of standard polysilicon gate materials in combination with the high-k dielectric material. To this end, appropriate metal-containing materials may be provided so as to cover the sensitive high-k dielectric materials and act as a source for incorporating an appropriate metal species, such as lanthanum, aluminum and the like, in order to appropriately adjust the work function for N-channel transistors and P-channel transistors, respectively. Furthermore, due to the presence of a metal-containing conductive material, the generation of a depletion zone, as may typically occur in polysilicon-based electrode materials, may be substantially avoided.

The process of fabricating a sophisticated gate electrode structure on the basis of a high-k dielectric material may require a moderately complex process sequence in order to adjust an appropriate work function for the transistors of different conductivity type and due to the fact that high-k dielectric materials may typically be very sensitive when exposed to certain process conditions, such as high temperatures in the presence of oxygen and the like. Therefore, different approaches have been developed, such as providing the high-k dielectric material at an early manufacturing stage and processing the semiconductor devices with a high degree of compatibility with standard process techniques, wherein the typical electrode material polysilicon may be replaced in a very advanced manufacturing stage with appropriate metals for adjusting the work function of the different transistors and for providing a highly conductive electrode metal.

In other approaches the sophisticated gate electrode structures may be formed in an early manufacturing stage, while the further processing is based on many well-established process strategies. In this case, the high-k dielectric material and any metal species for adjusting the work function may be provided prior to or upon patterning the gate electrode stack, which comprises well-established materials, such as silicon and silicon/germanium.

In addition to providing sophisticated gate electrode structures, transistor performance may also be significantly enhanced by using a strain component in the channel region of at least one type of transistor, such as in P-channel transistors. It is well known that providing a compressive strain component along the current flow direction in a silicon channel region having a standard crystalline configuration may result in superior mobility of holes in the channel region, thereby also improving the drive current capability of the P-channel transistor. For this reason, a plurality of strain-inducing mechanisms have been developed, wherein one promising approach may be based on a strain-inducing semiconductor alloy, which is embedded into the active region of P-channel transistors after patterning the gate electrode structure. To this end, cavities may be formed in the active region laterally adjacent to the gate electrode structure and the cavities are subsequently refilled with a strain-inducing semiconductor alloy, such as a silicon/germanium material, which is grown in a strained state that in turn induces a desired compressive strain component in the channel region. The strain-inducing silicon/germanium material may be deposited on the basis of selective epitaxial growth techniques, in which process parameters are adjusted such that significant material deposition is restricted to crystalline silicon areas, while any material deposition on dielectric surface areas is suppressed. In order to avoid undue material growth on the gate electrode structures, the polysilicon material has to be reliably confined at least during the selective epitaxial growth process. For this purpose, the gate electrode structures are typically provided with a dielectric cap material, such as a silicon nitride material, and a silicon nitride spacer layer is typically provided so as to cover the N-channel transistors, while the silicon nitride spacer layer is patterned into sidewall spacer elements at the gate electrode structure of the P-channel transistor, wherein, in the same etch sequence, the corresponding cavities are also formed in the active region of the P-channel transistor.

Since the dielectric cap material has to be removed in a later manufacturing stage, it turns out that the incorporation of the strain-inducing semiconductor alloy in the P-channel transistor may significantly affect production yield in manufacturing strategies in which sophisticated high-k metal gate electrode structures are to be provided, as will be explained in more detail for a replacement gate approach with reference to FIGS. 1a-1b.

Figure 1A:
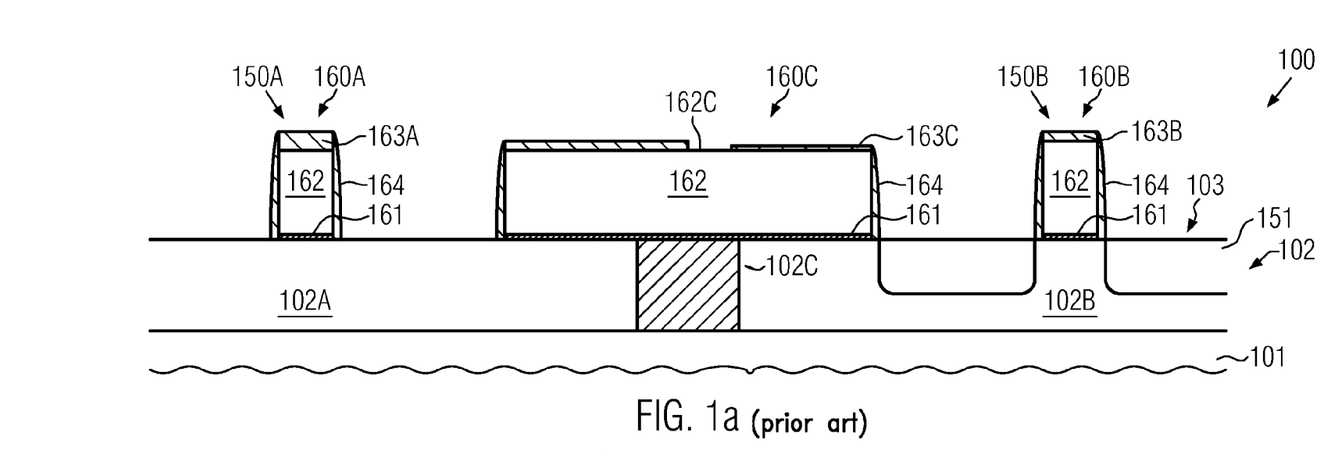
FIGS. 1a-1b schematically illustrate cross-sectional views of a semiconductor device during various manufacturing stages in performing a conventional complex process sequence, for instance, a replacement gate approach, in which the difference of certain material layers caused by a difference in process history and/or a dependency on pattern density may result in significant device variations.

FIG. 1a schematically illustrates a cross-sectional view of a semiconductor device 100 comprising a substrate 101, above which is formed a silicon-based semiconductor layer 102. The substrate 101 and the semiconductor layer 102 may represent a silicon-on-insulator (SOI) configuration, when a buried insulating material (not shown) is positioned between the substrate 101 and the semiconductor layer 102. In other cases, a "bulk" configuration is provided, when the semiconductor layer 102 represents a portion of a crystalline material of the substrate 101. The semiconductor layer 102 comprises a plurality of "active regions," such as semiconductor regions 102A, 102B, which are to be understood as semiconductor regions, in which appropriate dopant profiles are to be established so as to form PN junctions of one or more transistor elements. For example, the active region 102A represents a semiconductor region having an appropriate basic doping so as to correspond to an N-channel transistor 150A, while the semiconductor region 102B may represent a P-channel transistor 150B. The semiconductor regions 102A, 102B are laterally delineated in the semiconductor layer 102 by an isolation structure 102C, for instance a shallow trench isolation.

Moreover, in the manufacturing stage shown, a first gate electrode structure 160A is formed on the active region 102A and comprises a gate insulation layer 161, for instance in the form of a silicon dioxide-based material, possibly in combination with a high-k dielectric material, such as hafnium oxide and the like, while, in other approaches, the high-k dielectric material may be provided in a later manufacturing stage. Moreover, the gate electrode structure 160A comprises a silicon material 162 and a dielectric cap layer 163A, such as a silicon nitride material. Furthermore, a sidewall spacer structure 164 in the form of a silicon nitride material is provided in the gate electrode structure 160A. Similarly, a gate electrode structure 160B is formed on the active region 102B and comprises the components 161, 162, and 164. Furthermore, a dielectric cap layer 163B in the form of a silicon nitride material is provided, wherein typically the dielectric cap layer 163B may have a reduced thickness compared to the dielectric cap layer 163A, which may result in significant yield loss during the further processing of the device 100. Furthermore, a "gate electrode structure" 160C is provided so as to extend above the active region 102B and the isolation structure 102C and above the active region 102A. The electrode structure 160C may represent any appropriate polysilicon line for connecting the active regions 102A, 102B or the structure 160C may represent actual gate electrode structures of transistors formed in the active regions 102A, 102B, respectively. The electrode structure 160C also comprises a gate insulation layer 161, at least above the active regions 102A, 102B, and the silicon material 162. Moreover, a dielectric cap layer 163C is formed on the silicon material 162 and may have a different thickness caused by the preceding processing of the device 100. In some cases, even a substantially non-covered surface area 162C may have been produced during the preceding manufacturing processes, which may also negatively affect the further processing of the device 100. Moreover, in the manufacturing stage shown, a strain-inducing semiconductor alloy 151, such as a silicon/germanium alloy is formed in cavities 103, which are provided in the active region 102B laterally adjacent to the gate electrode structure 160B.

The semiconductor device 100 as illustrated in FIG. 1a may be formed on the basis of the following processes. First, the active regions 102A, 102B are geometrically defined in view of their lateral position, size and shape by forming the isolation structure 102C, which is accomplished by forming trenches in the semiconductor layer 102 using appropriate lithography techniques and subsequently refilling the trenches with an appropriate insulating material, such as silicon dioxide, silicon nitride and the like. Next, the basic doping, i.e., the well doping, is established in the active regions 102A, 102B in accordance with the required characteristics of the transistors 150A, 150B, which may be accomplished by using well-established masking regimes in combination with implantation processes. Next, the gate dielectric material 161 is formed, for instance by oxidation and/or deposition, depending on the process strategy. For instance, if a high-k dielectric material is to be provided in this manufacturing stage, any appropriate deposition techniques are used for forming the high-k dielectric material on a corresponding thin layer of a conventional dielectric material, such as silicon dioxide, silicon oxynitride and the like. If required, an appropriate cap material, such as a conductive cap material (not shown), may be provided so as to confine the high-k dielectric material. Thereafter, the silicon material 162 is deposited, for instance by well-established low pressure chemical vapor deposition (CVD) techniques, followed by the deposition of the silicon nitride material of the cap layers 163A, 163B, and 163C. Furthermore, any further materials, such as hard mask materials, for instance in the form of amorphous carbon and the like, are deposited and are subsequently patterned on the basis of sophisticated lithography and etch techniques, thereby finally forming the gate electrode structures 160A, 160B, 160C, having the required critical dimensions, which may correspond to a gate length, i.e., in FIG. 1a, the horizontal extension of the electrode material 162, of 40 nm and less.

After the corresponding gate patterning process, the gate electrode structures 160A, 160B, 160C comprise the dielectric cap materials 163A, 163B, 163C with substantially the same thickness, which may be approximately 40 nm. Thereafter, a spacer layer comprised of silicon nitride material is deposited by any appropriate process technique, such as multilayer deposition, low pressure CVD and the like, in order to obtain the desired material characteristics for the sidewall spacers 164. Subsequently, a resist mask is provided so as to cover the active region 102A and the corresponding part of the isolation structure 102C, while the active region 102B and the adjacent portion of the isolation structure 102C are exposed. On the basis of the corresponding resist mask, an anisotropic etch process is performed so as to first etch through the silicon nitride material of the spacer layer, thereby forming the sidewall spacers 164 on the gate electrode structure 160B and at the right hand side of the gate electrode structure 160C. Upon further continuing the etch process, based on an appropriate etch chemistry, the cavities 103 may be formed in the active region 102B, wherein a lateral offset from the electrode material 162 of the gate electrode structures 160B, 160C is determined by the width of the previously produced spacer elements 164. When forming the cavities 103, however, also the cap layer 163B and the exposed portion of the cap layer 163C are exposed to the reactive etch ambient, thereby increasingly removing material from these layers, which may finally result in the reduced thickness, as is shown in FIG. 1a. After the etch process, the resist mask is removed and any required cleaning processes are performed so as to prepare the device 100 for a subsequent selective epitaxial growth process for refilling the cavities 103 with the silicon/germanium material 151.

As previously explained, during the selective epitaxial growth process, a significant deposition of material 151 on dielectric surface areas is suppressed so that the spacer layer still formed above the semiconductor region 102A, the gate electrode structure 160A and the electrode structure 160C may suppress, in combination with the spacer structures 164, a material deposition. On the other hand, the material 151 may be efficiently deposited in the cavities 103, while the cap layer 163B in combination with the sidewall spacer structure 164 may confine the electrode material 162. Next, the spacer layer formed above the active region 102A and a portion of the isolation structure 102C is patterned so as to form the sidewall spacer elements 164 of the gate electrode structure 160A and the corresponding portion of the electrode structure 160C, which may be accomplished by forming a resist mask above the active region 102B and the corresponding portion of the electrode structure 160C. It should be appreciated that a certain degree of material erosion may also occur in the cap layer 163A upon patterning the spacer layer, however, at a significantly lesser extent compared to the material loss in the cap layer 163B, which has also experienced the cavity etch process. Furthermore, depending on the alignment accuracy for forming the corresponding resist masks, one of which protects the semiconductor region 102A when etching the cavities 103, and another one of which covers the semiconductor region 102B when patterning the spacer layer so as to form the spacer structure 164 of the gate electrode structure 160A, a significant loss of material may be observed in the spacer layer 163C, when a corresponding portion may be exposed twice to a reactive etch ambient. Consequently, a moderately high probability may exist for producing the substantially exposed surface portion 162C in the transition area of the shared electrode structure 160C. Consequently, the further processing is continued on the basis of a significant difference in layer thickness of the dielectric cap layers 163A, 163B, while also a significant difference in thickness may exist within the cap layer 163C, which may even include the substantially exposed surface portion 162C.

Figure 1B:
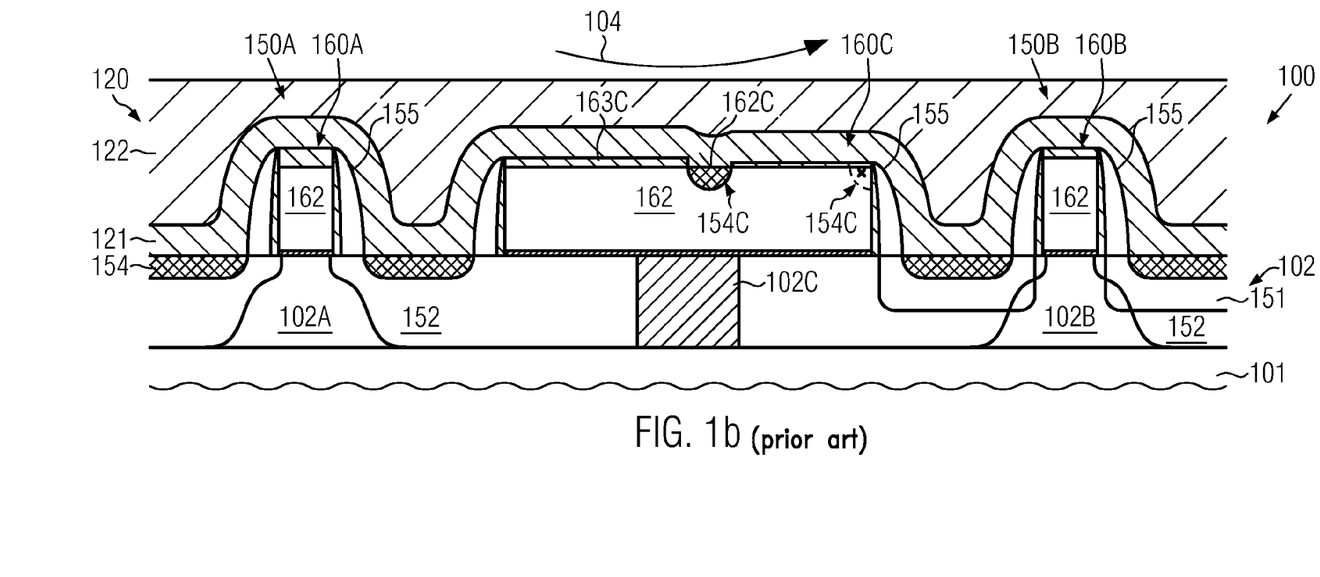

FIG. 1b schematically illustrates the semiconductor device 100 in a further advanced manufacturing stage. As illustrated, the device 100 comprises drain and source regions 152 in the active regions 102A, 102B, in combination with metal silicide regions 154. Furthermore, a spacer structure 155 is formed on the sidewalls of the gate electrode structures 160A, 160B and 160C. Additionally, an interlayer dielectric material 120 or at least a portion thereof is formed so as to enclose the gate electrode structures 160A, 160B, 160C, and comprises, for instance, a silicon nitride layer 121 in combination with a silicon dioxide material 122.

The device 100 as illustrated in FIG. 1b may be formed on the basis of any appropriate process strategy. For example, after patterning the gate electrode structures 160A, 160B, 160C, the drain and source regions 152 in combination with the spacer structure 155 may be formed, for instance, by applying an appropriate masking regime for covering the active region 102B and a corresponding part of the isolation structure 102C in order to introduce appropriate dopant species into the active region 102A, thereby forming a first portion of the drain and source regions 152, such as an extension region. Upon masking the active region 102A and the associated part of the isolation structure 102C, the corresponding dopant species may be incorporated into the active region 102B. The implantation sequence may be performed on the basis of a dedicated offset spacer structure (not shown) which may be used to appropriately adjust the lateral offset of the dopant species for the extension regions and for any other dopant species, such as halo dopant species and the like.

Thereafter, the spacer structure 155 may be formed by using deposition and etch techniques, followed by a further implantation sequence for completing the drain and source regions 152. Thereafter, anneal processes are performed in order to adjust the final dopant profile. In some cases, a metal silicide 154, as indicated in FIG. 1b, may be formed by providing an appropriate refractory metal, such as nickel and the like, and initiating a chemical reaction by performing a heat treatment. During the silicidation process, however, also metal silicide may form in any exposed surface portion, such as the portion 162C, thereby generating a metal silicide 154C. Similarly, the reduced thickness of the cap layer 163B may result in an increased probability of creating metal silicide residues within the semiconductor material 162.

It should be appreciated that the above-described complex process sequence may require a plurality of deposition processes and etch processes, many of which may exhibit a significant dependency on pattern density. That is, the deposition rate and/or the etch rate of any such complex processes may depend on the density of device features, such as gate electrode structures, that are provided per unit area. For example, in device areas in which the number of gate electrode structures per unit area is moderately high, the resulting deposition rate and etch rate may differ from device areas in which a lower number of gate electrode structures per unit area is provided. For example, densely packed device areas, such as static RAM areas, are considered as device areas having a high pattern density, since a plurality of closely spaced gate electrode structures and thus transistors are typically provided in these device regions. Consequently, any irregularities, as discussed above, for instance with the difference in thickness of the cap layers 163A, 163B, the width of any spacer structures and the like, may also significantly depend on the local pattern density, which may thus contribute to a pronounced variation of transistor characteristics, such as threshold voltage, current drive capability and the like.

During the further processing of the semiconductor device 100, the interlayer dielectric material 120, for instance comprising the layers 121 and 122, may be formed on the basis of well-established plasma enhanced CVD techniques and the like, followed by a planarization process. Furthermore, during a further process, the materials 162 of the gate electrode structures 160A, 160B, 160C has to be exposed in order to be replaced with any appropriate electrode materials, work function adjusting species, high-k dielectric materials and the like. To this end, the process 104 may typically comprise a chemical mechanical planarization (CMP), process wherein, however, the difference in thickness of the cap materials 163A, 163B (FIG. 1a) may result in extremely complex process conditions, in particular if a significant variation across the entire die and substrate is taken into consideration, as discussed above. Consequently, a reliable exposure is difficult to achieve during the process 104 and may thus require pronounced over-polish time, thereby even further contributing to a pronounced non-uniformity of the resulting device configuration. Moreover, in the case that metal silicide regions have been formed, any unwanted metal silicide residues may negatively affect the subsequent selective etch processes for removing the polysilicon material 162. For example, well-established etch chemistries, such as TMAH (tetra methyl ammonium hydroxide) may be used, which may, however, not efficiently remove, for instance, metal silicide or any other material residues, such as silicon dioxide, silicon nitride and the like.

Consequently, upon forming complex high-k metal gate electrode structures in accordance with a replacement gate approach, significant yield loss, or at least pronounced variations of device characteristics, may be caused during the above-described process sequence. The incorporation of a strain-inducing semiconductor material into the drain and source areas of P-channel transistors is an extremely efficient performance enhancing mechanism which, however, may also be the reason for pronounced transistor variations, in particular upon further scaling the overall transistor dimensions. In view of this situation, it has been proposed to at least reduce the dependency on pattern density and in particular the difference in thickness of the dielectric cap layers 163A, 163B and 163C upon forming an embedded strain-inducing semiconductor material. To this end, a further hard mask material may be used, for instance in the form of a silicon dioxide layer, which may be provided prior to forming the cavities 103 of FIG. 1a. In this case, the spacer structure 164 may be formed on the basis of a silicon nitride material that may be patterned commonly for P-channel transistors and N-channel transistors, thereby also exposing the cap layers 163A, 163B to substantially the same process conditions, which may thus result in a substantially identical thickness of these cap materials. Thereafter, the silicon dioxide layer may be provided and patterned in order to expose the P-channel transistor and thereafter corresponding etch processes may be applied, which may be more selective with respect to silicon nitride compared to the conventional process regime, as described above. In this case, the silicon nitride consumption upon forming the cavities 103 may be reduced, wherein, however, it has been observed that nevertheless a pronounced difference in thickness may occur. Furthermore, providing the additional hard mask material in the form of a silicon dioxide material, such as an undoped silicon dioxide material, may not efficiently address the problem of increased dependency on pattern density, thereby still resulting in pronounced variations across the die and also across entire substrates. Consequently, although theoretically providing a thin silicon dioxide hard mask material may provide less critical process conditions, it nevertheless turns out that, upon further device scaling, significant device variations may be observed.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure addresses the problem of pronounced dependency on pattern density when forming moderately thin silicon dioxide material layers in sophisticated semiconductor devices, in particular in approaches in which embedded strain-inducing semiconductor materials may have to be incorporated into the active region of at least one type of transistor. Furthermore, the present disclosure may also address situations in which spacer elements may have to be provided with a well-controlled width on the basis of a silicon dioxide material in order to accurately adjust dopant profiles and the like with a significant reduced degree of dependency on pattern density. To this end, a silicon dioxide material may be provided in the form of a double liner, wherein generally a thickness may be accomplished of approximately 50 nm and significantly less, while at the same time superior bottom-to-top step coverage of circuit features, such as gate electrode structures, may be achieved, while also the dependency on pattern density may be reduced. For this purpose, the silicon dioxide double liner may be formed on the basis of an undoped silicon dioxide material, which is to be understood as a silicon dioxide material in which contents of atomic species other than silicon and oxygen may be less than approximately 0.5 atomic percent, followed by a further liner material, which is also indicated as a silicon dioxide material, which, however, may be formed on the basis of a high density plasma CVD process in the presence of a dedicated hydrogen gas in order to provide superior gap filling capabilities and reducing the overall dependency on pattern density. Consequently, since the basic undoped silicon dioxide layer, which may also be formed on the basis of a high density plasma CVD process, may be provided with a reduced thickness, for instance in the range of approximately 20 nm or even less, followed by the hydrogen-containing silicon dioxide material having the superior gap filling capability, in total, a desired combined layer thickness may be achieved, which may be sensitive to a significantly lesser degree with respect to pattern density compared to conventionally provided thin silicon dioxide materials. In this manner, a plurality of critical process steps requiring a silicon dioxide material may be performed on the basis of superior uniformity, which may thus result in overall increased performance and reduced yield losses. In some illustrative embodiments disclosed herein, strain-inducing mechanisms on the basis of incorporated semiconductor materials are formed with superior uniformity, for instance in critical replacement gate approaches and the like. In other cases, additionally or alternatively to the above application of the superior silicon dioxide double liner, critical spacer elements, such as offset spacers, may be provided on the basis of the double liner, thereby also resulting in superior transistor characteristics, in particular in highly scaled semiconductor devices.

One illustrative method disclosed herein relates to forming a silicon dioxide layer in a semiconductor device. The method comprises depositing a first silicon dioxide layer by performing a chemical vapor deposition process above a plurality of circuit features that are formed above a substrate. The method further comprises depositing a second silicon dioxide layer on the first silicon dioxide layer by performing a high density plasma chemical vapor deposition process, wherein a combined thickness of the first and second silicon dioxide layers is approximately 50 nm or less.

A further illustrative method disclosed herein relates to forming a semiconductor device. The method comprises forming a first gate electrode structure above a first semiconductor region and a second gate electrode structure above a second semiconductor region. The method further comprises forming a silicon dioxide double liner above the first and second gate electrode structures, wherein the silicon dioxide double liner comprises an undoped silicon dioxide layer and a hydrogen-containing silicon dioxide layer. Moreover, an etch process is performed so as to form a spacer element from the silicon dioxide double liner at least on the first gate electrode structure.

One illustrative semiconductor device disclosed herein comprises a gate electrode structure that in turn comprises a sidewall spacer element formed of a silicon dioxide double liner. The silicon dioxide double liner comprises a first liner formed of an undoped silicon dioxide material and a second liner formed of a hydrogen-containing silicon dioxide material.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure generally provides semiconductor devices and manufacturing techniques in which a thin silicon dioxide layer, i.e., a silicon dioxide layer having a thickness of approximately 50 nm and less, may be provided with a significantly reduced dependency on pattern density in order to provide superior process conditions during the further processing when patterning the silicon dioxide double liner material. As previously discussed with reference to the semiconductor device 100, in sophisticated semiconductor devices, complex process situations may occur in which superior process uniformity may require the deposition of a thin silicon dioxide material, wherein, however, the degree of non-uniformity introduced by the silicon dioxide material itself may have to be significantly less compared to the degree of process non-uniformity to be "compensated" for by the silicon dioxide layer. As explained above, for example, superior uniformity of a dielectric cap material of sophisticated gate electrode structures, in particular during a process for embedding a strain-inducing semiconductor material, may be achieved by providing a silicon dioxide hard mask material, as long as the non-uniformity of the silicon dioxide material may be significantly less compared to the difference in thickness of the dielectric cap material. In other situations, spacer elements may have to be provided with well-defined width across the entire die and also across substrates in order to allow a precise specification of the electrical device performance, in particular in highly scaled semiconductor devices. For example, offset spacers for defining the lateral offset of drain and source extension regions and the like may have a significant influence on the finally achieved transistor characteristics, which may conventionally suffer from a pronounced dependency on pattern density of the initial spacer layer formed from silicon dioxide material.

In order to address any specific process situations in which a thin silicon dioxide material may have to be provided with superior across-die uniformity and across-substrate uniformity, a silicon dioxide double liner may be provided, wherein a combined thickness may be 50 nm and less, depending on the process and device requirements. To this end, the silicon dioxide material may be deposited on the basis of, for instance, a high density plasma CVD process so as to form an undoped silicon dioxide material, which is to be understood in the above-defined sense. Thereafter, a second liner material may be deposited so as to contain a certain fraction of hydrogen, which may result in superior gap filling capability and a reduced dependency on pattern density. The second silicon dioxide layer may be formed on the basis of a high density plasma environment in the presence of a dedicated hydrogen source, such as a hydrogen gas. It is generally known that a high density plasma environment may typically be established on the basis of a reduced process pressure, which may typically be two orders of magnitude less compared to conventional plasma enhanced CVD processes for forming silicon dioxide, thereby obtaining, in combination with the increased plasma density, a reduced dependency of the presence of the gas components at any surface areas, for instance within openings, on extended horizontal surface areas and the like, thereby contributing to the superior gap filling capability. It has been discovered that forming an undoped silicon dioxide material in combination with the hydrogen-containing silicon dioxide material by means of a high density plasma may provide the required material characteristics in terms of etch resistivity and the like, while at the same time a superior uniformity may be obtained, for instance when forming the double liner material above circuit elements formed above a semiconductor layer, so that a pronounced surface topography may be encountered, which may significantly differ in relation to the local pattern density. The double liner may be provided on the basis of any appropriate deposition platform, for instance by using the Centura platform of Applied Materials, which may be appropriate for processing 300 mm substrates, wherein a process temperature of less than 100° C. may be applied and wherein a deposition time of less than 100 seconds may result in a layer thickness of approximately 50 nm and less. It should be appreciated that any appropriate process parameters in terms of plasma power, gas flow rates of precursor gases, such as silane, oxygen, argon and the like, for instance for forming an undoped silicon material, and the flow rates of silane, oxygen, argon and hydrogen for forming the hydrogen-containing silicon dioxide material, may be readily established for any type of process tool by performing corresponding experiments. For example, well-established process parameters for forming undoped silicon dioxide materials and hydrogen-containing high density plasma silicon dioxide material may be applied in order to form the silicon dioxide double liner material within the above-specified thickness range.

With reference to FIGS. 2a-2f, and also with reference to FIGS. 1a-1b, further illustrative embodiments will now be described in more detail.

Figure 2A:
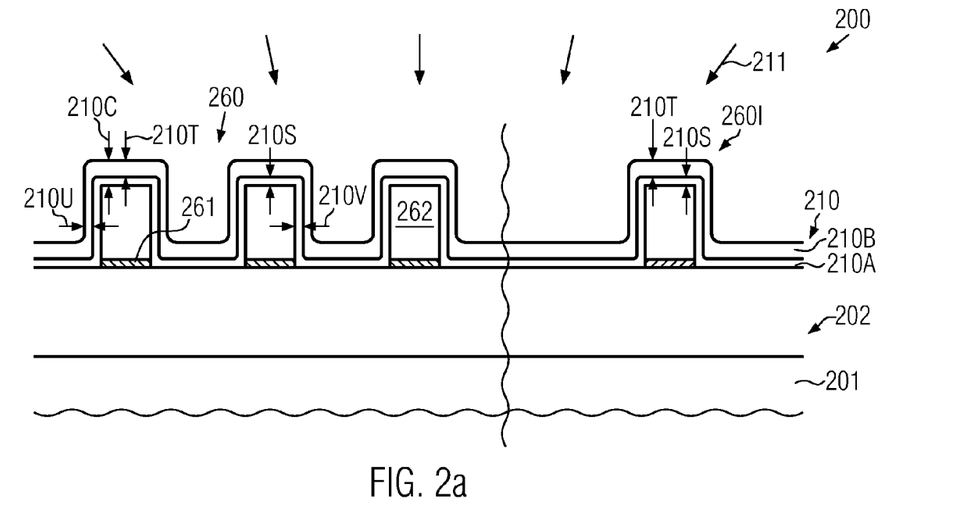
FIG. 2a schematically illustrates a cross-sectional view of a semiconductor device in a process phase in which a silicon dioxide double liner of appropriate thickness may be provided so as to reduce dependency on pattern density upon the further processing of the device, according to illustrative embodiments.

FIG. 2a schematically illustrates a cross-sectional view of a semiconductor device 200 comprising a substrate 201 and a semiconductor layer 202 formed thereon. The semiconductor layer 202 may typically be provided in the form of any appropriate semiconductor material which enables the formation of transistor elements in and above the semiconductor layer 202. Furthermore, the substrate 201 and the semiconductor layer 202 may form an SOI configuration or a bulk configuration, as is also discussed above with reference to the semiconductor device 100. In some illustrative embodiments, the semiconductor layer 202 may comprise a significant amount of silicon and the electronic characteristics, such as the charge carrier mobility, may be modified by inducing a certain type of strain therein, as is also described above with reference to the semiconductor device 100. In the manufacturing stage shown, the device 200 may comprise a plurality of circuit elements 260, 260I, which may, in some illustrative embodiments, represent gate electrode structures formed above the semiconductor layer 202 or above the isolation regions (not shown) provided therein. For example, the gate electrode structures 260 may represent closely spaced gate electrode structures and may thus represent a device area having a moderately high pattern density. For example, the width of the gate electrode structures 260, i.e., in FIG. 2a, the horizontal extension thereof, may be 100 nm and less, while also a pitch may be a comparable order of magnitude, for instance in the range of 300 nm and significantly less. On the other hand, the gate electrode structure 260I may be provided in a device area having a significantly reduced pattern density. That is, a distance to a next neighbor may be significantly greater compared to the pitch of the gate electrode structures 260.

The circuit elements 260 may have substantially the same configuration and may comprise, for instance, a dielectric material 261 in combination with a conductive material 262, such as a gate dielectric material and an electrode material. The dielectric material 261 may have any appropriate material composition, for instance it may comprise a high-k dielectric material, as is also discussed above. Similarly, the electrode material 262 may comprise a semiconductor material, metal-containing materials and the like. Furthermore, in the manufacturing stage shown, a silicon dioxide double liner 210 may be formed above the semiconductor layer 202 and the circuit features 260, 260I. The silicon dioxide double liner 210 may comprise a first silicon dioxide layer 210A, which may also be referred to as an undoped silicon dioxide material due to a reduced degree of non-silicon and non-oxygen species. Moreover, the double liner 210 may comprise a second silicon dioxide layer 210B, which may represent a silicon dioxide material having contained therein a specific degree of hydrogen, for instance in the range of approximately 5 atomic percent to 0.5 atomic percent.

The semiconductor device 200 may be formed on the basis of the following processes. The gate electrode structures 260, 260I may be provided on the basis of any appropriate process strategy, for instance as also discussed above with reference to the semiconductor device 100. It should be appreciated that, if required, additional spacer structures may be provided on sidewalls of the materials 261 and 262. In other cases, the silicon dioxide double liner 210 may be used as an efficient material for forming spacer elements on the gate electrode structures 260, 260I, as will also be described later on in more detail. Next, a deposition process 211 may be performed in order to form the undoped silicon dioxide layer 210A, wherein, for instance, a high density plasma environment may be established, for instance on the basis of a process tool as specified above, wherein process parameters may be selected so as to substantially avoid the incorporation of any non-oxygen and non-silicon species. To this end, any known process recipes may be applied, wherein, in some illustrative embodiments, the high density plasma environment may be established on the basis of a process temperature of 100° C. and less, for instance in a range of approximately 65-85° C., for instance approximately 75° C. During the deposition process 211, hence, the material 210A may be formed with a thickness 210S of approximately 10-25 nm, depending on the required combined thickness 210C of the double liner 210. It should be appreciated that the thickness 210S may be determined on any horizontal surface areas, such as the top of the gate electrode structures 260, 260I, while a thickness on "vertical" surface areas, as indicated by 210V, may be less, for instance approximately 50 percent of the thickness 210S, or less. During the process 211, the process parameters may then be changed, for instance by adding an additional hydrogen source, such as a hydrogen gas, in order to form the hydrogen-containing layer 210B, wherein additional hydrogen may result in a superior deposition behavior, thereby reducing the overall dependency on pattern density. For example, as shown, the layer 210B may be provided with a thickness 210T, taken on horizontal surface portions, while a thickness 210U at vertical sidewalls areas may be less. Thus, particular horizontal sidewall surface areas, such as the top portions of the gate electrode structures 260, 260I, may receive the silicon dioxide material with increased thickness, wherein, however, a significantly reduced variation of the thickness may be observed for the gate electrode structures 260 and 260I. For example, for a combined thickness 210C of approximately 20 nm, a process time for the in situ process 211 may be in the above-specified range, for instance, it may be achieved with approximately 80 seconds and less.

Consequently, due to the reduced dependency on the pattern density of the double liner 210, the further processing may be continued by patterning the double liner 210, for instance in order to form sidewall spacer elements, at least on some of the gate electrode structures 260, 260I, wherein, due to the superior uniformity of the initial thickness 210C and thus of the combined thickness 210V, 210U at the sidewall surface areas thereof, a resulting spacer width of superior uniformity may be achieved.

Figure 2B:
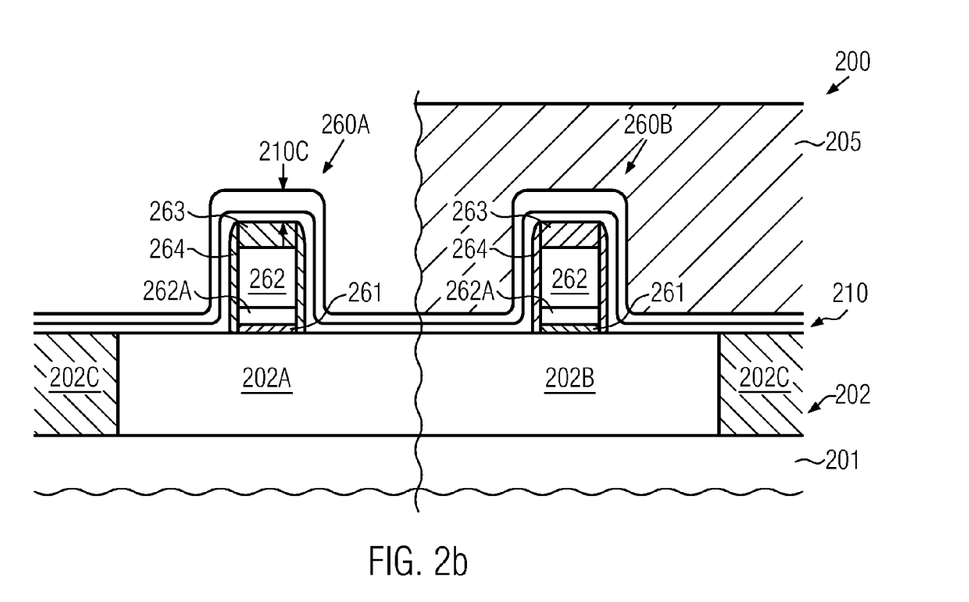
FIGS. 2b-2d schematically illustrate cross-sectional views of the semiconductor device according to illustrative embodiments in which superior uniformity of a dielectric cap material of gate electrode structures may be obtained on the basis of the silicon dioxide double liner, when providing an embedded strain-inducing semiconductor alloy, for instance during a replacement gate approach, according to further illustrative embodiments.
Figure 2C:
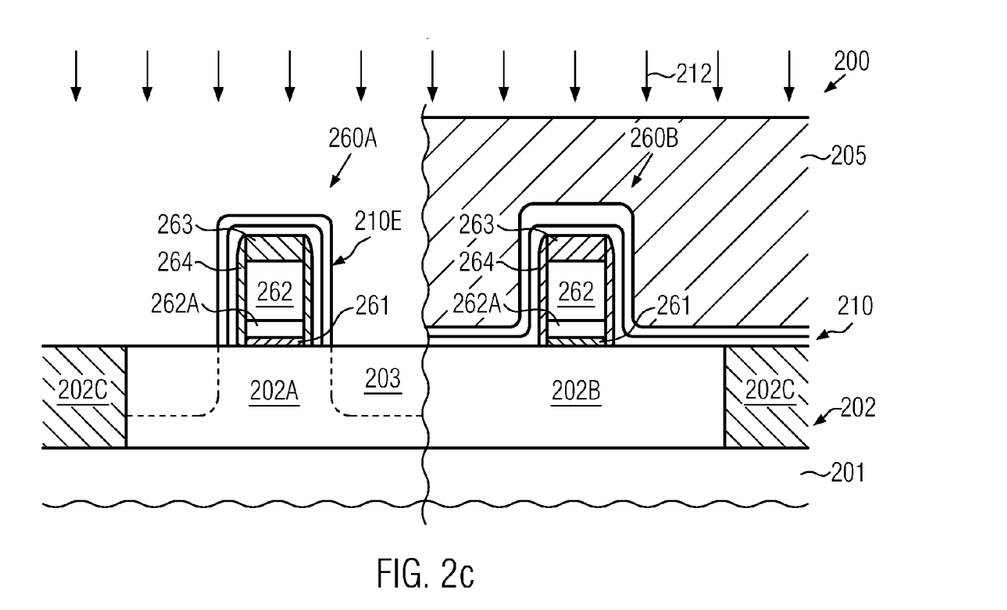
Figure 2D:
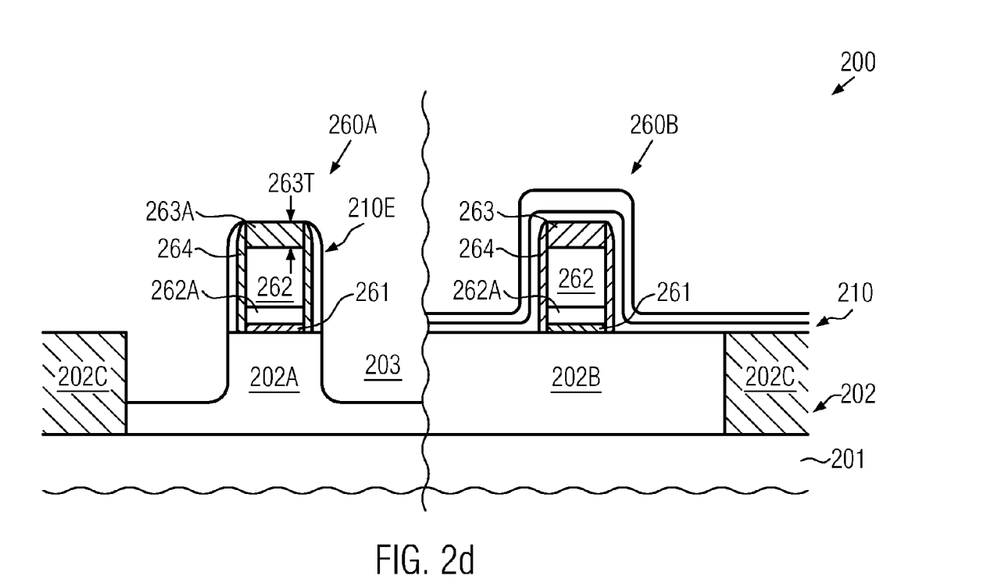

With reference to FIGS. 2b-2d, further illustrative embodiments will now be described in which the silicon dioxide double liner may be used as an efficient hard mask when forming a strain-inducing semiconductor material.

FIG. 2b schematically illustrates the semiconductor device 200 in a manufacturing stage in which active regions 202A, 202B may be provided in the semiconductor layer 202 on the basis of an isolation structure 202C. Furthermore, a gate electrode structure 260A may be formed on the active region 202A and a gate electrode structure 260B may be formed on the active region 202B. The gate electrode structures 260A, 260B may comprise a gate dielectric material 261, possibly in combination with a conductive cap material 262A and an electrode material 262. Moreover, a dielectric cap material 263 may be formed on the electrode material 262, while also a sidewall spacer structure 264 may be provided so as to confine the materials 262, 262A and 261 by means of the cap layer 263 and the spacer structure 264. The dielectric material 261 may comprise a high-k dielectric material, while, in other cases, the dielectric material 261 may be comprised of a conventional dielectric material while the conductive cap material 262A may be omitted in this manufacturing stage, as for instance discussed above with reference to the semiconductor device 100. The gate electrode structures 260A, 260B may be formed on the basis of process techniques as are also described above for forming the materials 261, 262 and 263, wherein, if a high-k dielectric material is to be incorporated into the material 261, any appropriate deposition recipes may be applied. Similarly, the material 262A, which may have a different material composition for the gate electrode structures 260A, 260B, may be provided on the basis of any appropriate process strategy. Thereafter, a spacer material, such as a silicon nitride material and the like, may be deposited, for instance by multi-layer deposition techniques and the like, in order to achieve the desired material characteristics. Thereafter, a patterning process may be applied in a non-masked manner for the gate electrode structures 260A, 260B, thereby forming the spacer structure 264. Consequently, the dielectric cap material 263 may experience the same process history and may thus have substantially the same thickness for the gate electrode structures 260A, 260B. Next, the silicon dioxide double liner 210 may be formed, for instance, on the basis of process techniques described above, wherein it should be appreciated that superior uniformity in thickness 210C may be accomplished for the gate electrode structures 260A, 260B, irrespective of whether densely packed device regions or device regions of less pronounced packing density are considered. Thereafter, an etch mask 205 such as a resist mask, may be provided on the basis of well-established lithography techniques.

FIG. 2c schematically illustrates the semiconductor device 200 when exposed to an etch process 212 in order to etch the material of the double liner 210, thereby forming a spacer element 210E on sidewalls of the gate electrode structure 260A. To this end, appropriate etch chemistries may be applied, which may provide superior etch selectivity with respect to the dielectric cap material 263. For example, contrary to the conventional approaches described above with reference to the device 100, a significantly reduced degree of material erosion may occur in the cap layer 263 during the etch process 212 when forming the spacer elements 210E. Furthermore, the etch process 212 may be continued so as to etch into exposed portions of the active region 202A in order to form cavities 203 therein. Due to the superior selectivity of the etch process 212, reduced material erosion may occur in the cap layer 263 during the further advance of the silicon dioxide etch process when concurrently etching into the active region 202A. For example, on the basis of well-established plasma assisted etch techniques for etching silicon dioxide selectively with respect to silicon nitride material, an etch depth of approximately 40-50 nm for the cavities 203 may be accomplished, while a corresponding material removal in the cap material 263 may be approximately 10 nm or significantly less.

FIG. 2d schematically illustrates the semiconductor device 200 in a further advanced manufacturing stage. As shown, the cavities 203 are formed in the active region 202A and the etch mask 205 (FIG. 2c) is removed from above the active region 202B. Moreover, the thickness 263T of the cap material, now indicated by reference sign 263A, may be reduced to a certain degree, wherein, however, compared to the conventional strategies described above, a significant improvement may be achieved so that the materials 263A and 263 may provide superior process conditions during the further processing, for instance when performing a replacement gate approach that requires a complex process for removing the cap materials 263A, 263 in a very advanced manufacturing stage, as described above. In other cases, the reduced material consumption in the layer 263A may improve the further processing according to any other process strategy, since typically the cap materials 263A, 263 may have to be removed at any appropriate manufacturing stage, for instance for providing a metal silicide in the gate electrode structures 260A, 260B and the like. Moreover, the double liner 210 may still cover the active region 202B and the gate electrode structure 260B and may thus enable the deposition of a strain-inducing semiconductor material into the cavities 203, thereby acting as an efficient deposition mask. To this end, any well-established process techniques, as described above with reference to the device 100, may be applied. Thereafter, the oxide material of the liner 210 and of the spacer 210E may be removed, for instance on the basis of wet chemical etch chemistries and the like, which may have a high selectivity, thereby not unduly affecting the silicon nitride material of the cap layers 263A, 263 and of the spacer structures 264. Consequently, the further processing may be continued on the basis of superior uniformity with respect to the cap materials 263A, 263 and also with respect to the spacer structure 264.

Figure 2E:
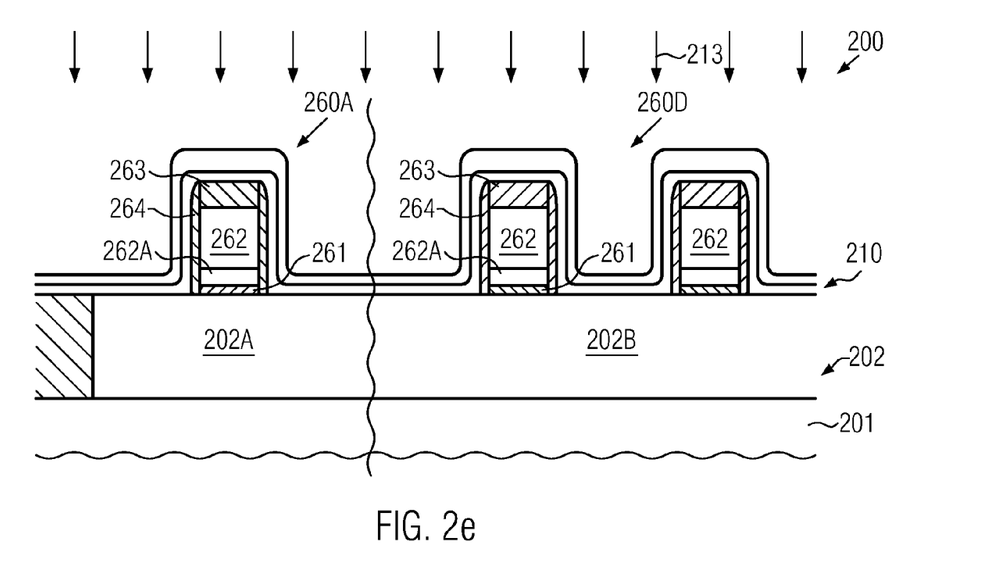
FIGS. 2e-2f schematically illustrate cross-sectional views of the semiconductor device wherein the silicon dioxide double liner may be used as a spacer material for forming spacer elements with superior uniformity in width, according to still further illustrative embodiments.

FIG. 2e schematically illustrates a cross-sectional view of the semiconductor device 200 according to further illustrative embodiments in which the silicon dioxide double liner 210 may be formed as a spacer layer above the active region 202A comprising the gate electrode structure 260A at any appropriate manufacturing stage and above an active region 202B comprising densely spaced gate electrode structures 260D. Also in this case, the gate electrode structures 260A, 260D may have any appropriate configuration, such as described above with reference to FIGS. 2a and 2b and the like. Furthermore, the device 200 is exposed to an etch process 213 in order to pattern the double liner 210, thereby forming sidewall spacer elements. To this end, any well-established plasma assisted etch recipes may be applied.

Figure 2F:
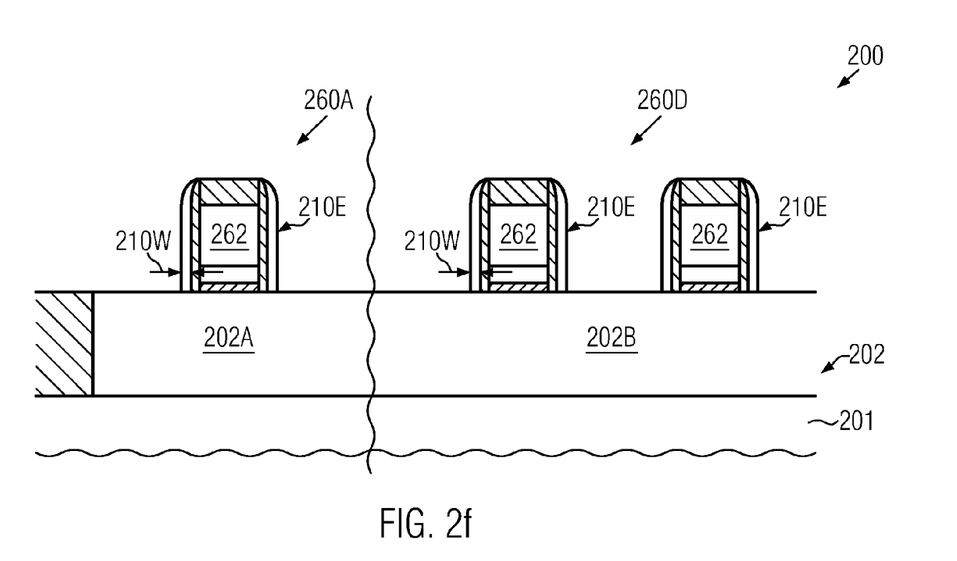

FIG. 2f schematically illustrates the semiconductor device 200 with sidewall spacers 210E formed on the gate electrode structures 260A, 260D, wherein a width 210W of the spacers 210E may have superior uniformity due to the superior uniformity of the initial double liner 210 (FIG. 2e). Consequently, the further processing may be continued, for instance, by performing an implantation process and the like, in order to incorporate drain and source dopant species, for instance for forming extension regions and the like, wherein the resulting profile as implanted may have a significantly reduced dependency on pattern density due to the superior uniformity of the width 210W. Thereafter, the spacers 210E may be removed or may be maintained, depending on the overall process requirements.

It should be appreciated that forming the spacers 210E may be further combined with the incorporation of a strain-inducing semiconductor material, as described with reference to FIGS. 2b-2d, if required. Moreover, the gate electrode structures 260D, 260A may be formed so as to receive at least a metal-containing electrode material in a very advanced manufacturing stage, as is also described above with reference to the semiconductor device 100.

As a result, the present disclosure provides manufacturing techniques and semiconductor devices in which a silicon dioxide double liner may be used as a hard mask material, a spacer layer and the like, in particular in sophisticated semiconductor devices, in order to reduce the dependency on pattern density. In some illustrative embodiments, the double liner may be efficiently used as a hard mask material during the incorporation of a strain-inducing semiconductor material, which may provide superior uniformity of a dielectric cap material provided on sophisticated gate electrode structures. Consequently, upon incorporating the strain-inducing semiconductor material, the further processing may be continued on the basis of superior process conditions since, for instance, any difference in thickness of dielectric cap material may be reduced. For example, high-k metal gate electrode structures may be provided in an early manufacturing stage or on the basis of a replacement gate approach, wherein, in each case, superior similarity of the dielectric cap materials between P-channel transistors, N-channel transistors, between densely packed device areas and less densely packed device areas may be improved, thereby also contributing to significantly less device variations, for instance in terms of transistor variability and the like.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming a silicon dioxide cover layer on a semiconductor device, the method comprising:

depositing an undoped silicon dioxide layer in a process ambient by performing a chemical vapor deposition process above a plurality of circuit features formed above a substrate, wherein said undoped silicon dioxide layer comprises substantially horizontal portions covering at least substantially horizontal surfaces of said plurality of circuit features and substantially vertical portions covering substantially vertical surfaces of said plurality of circuit features; and depositing a hydrogen-containing silicon dioxide layer on said substantially horizontal and vertical portions of said undoped silicon dioxide layer by performing a high density plasma chemical vapor deposition process, wherein depositing said hydrogen-containing silicon dioxide layer comprises adjusting said process ambient by adding an additional hydrogen source to said process ambient such that hydrogen from said additional hydrogen source is introduced into said hydrogen-containing silicon dioxide layer during said deposition thereof.

2. The method of claim 1, wherein at least some of said plurality of circuit features are formed on the basis of critical dimensions of approximately 100 nm or less.

3. The method of claim 1, wherein said undoped and said hydrogen-containing silicon dioxide layers are deposited in an in situ process.

4. The method of claim 1, wherein depositing said undoped and said hydrogen-containing silicon dioxide layers comprises adjusting a substrate temperature to approximately 100° C. or less.

5. The method of claim 4, wherein a deposition time for depositing said silicon dioxide cover layer is approximately 100 seconds or less.

6. The method of claim 1, wherein said hydrogen-containing silicon dioxide layer comprises hydrogen in the range of approximately 1.0 atomic percent to 5.0 atomic percent.

7. The method of claim 1, wherein said undoped silicon dioxide layer is deposited having a first sidewall portion thickness adjacent to sidewalls of said plurality of circuit features that is approximately 50 percent or less of a first top portion thickness of said undoped silicon dioxide layer deposited above top surfaces of said plurality of circuit features.

8. The method of claim 1, wherein, after forming said silicon dioxide cover layer, said undoped silicon dioxide layer covers all surfaces of said plurality of circuit features and at least a portion of an active region adjacent to at least some of said plurality of circuit features.

9. The method of claim 1, wherein said undoped silicon dioxide layer is formed with a hydrogen content that is less than approximately 0.5 atomic percent and said hydrogen-containing silicon dioxide layer is formed with a hydrogen content that is greater than approximately 1.0 atomic percent and less than approximately 5.0 atomic percent.

10. The method of claim 1, wherein said substantially horizontal surfaces comprises at least one of an active region of said semiconductor device and an upper surface of a gate electrode structure formed above said active region, and wherein said substantially vertical surfaces comprise a sidewall of said gate electrode structure.

11. A method of forming a semiconductor device, the method comprising:
forming a first gate electrode structure above a first semiconductor region of said semiconductor device and a second gate electrode structure above a second semiconductor region of said semiconductor device;
forming a silicon dioxide double liner above said semiconductor device, said silicon dioxide double liner comprising an undoped silicon dioxide layer and a hydrogen-containing silicon dioxide layer formed on said undoped silicon dioxide layer, said undoped silicon dioxide layer of said silicon dioxide double liner continuously covering at least an upper surface and sidewall surfaces of each of said first and second gate electrode structures and at least a portion of each of said first and second semiconductor regions and said hydrogen-containing silicon dioxide layer continuously covering an entirety of said undoped silicon dioxide layer, wherein forming said hydrogen-containing silicon dioxide layer comprises adjusting a process ambient used to form said undoped silicon dioxide layer by adding an additional hydrogen source to said process ambient and using said adjusted process ambient to form said hydrogen-containing silicon dioxide layer; and
performing an etch process so as to form a spacer element from said silicon dioxide double liner at least on said sidewall surfaces of said first gate electrode structure, said undoped silicon dioxide layer contacting said sidewall surfaces.

12. The method of claim 11, wherein performing said etch process comprises masking said second gate electrode structure and said second semiconductor region so as to preserve said silicon dioxide double liner above said second gate electrode structure and said second semiconductor region.

13. The method of claim 12, wherein performing said etch process further comprises forming cavities in said first semiconductor region.

14. The method of claim 11, wherein forming said first and second gate electrode structures comprises forming a dielectric cap layer above an electrode material and forming a sidewall spacer structure on sidewalls of said first and second gate electrode structures prior to forming said silicon dioxide double liner.

15. The method of claim 13, further comprising forming a strain-inducing semiconductor material in said cavities and using said silicon dioxide double liner and said spacer element as a deposition mask.

16. The method of claim 11, wherein forming said first and second gate electrode structures comprises forming said gate electrode structures with a gate length of approximately 100 nm or less.

17. The method of claim 16, wherein forming said first and second gate electrode structures further comprises forming a gate insulation layer so as to comprise a high-k dielectric material.

18. The method of claim 11, wherein performing said etch process comprises forming said spacer element on said first and second gate electrode structures.

19. The method of claim 18, further comprising using said spacer element as an offset spacer for forming drain and source extension regions in said first and second semiconductor regions.

20. The method of claim 11, wherein said silicon dioxide double liner is formed with a thickness above said upper surfaces of said first and second gate electrode structures of approximately 30 nm or less.

21. The method of claim 11, wherein forming said silicon dioxide double liner comprises performing a high density plasma chemical vapor deposition process.

22. The method of claim 21, wherein a process temperature for forming said silicon dioxide double liner is selected to be approximately 100° C. or less.

23. The method of claim 11, wherein forming said silicon dioxide double liner comprises performing an in situ deposition process, said in situ deposition process comprising depositing said undoped silicon dioxide layer in said process ambient, adjusting said process ambient by adding said additional hydrogen source to said process ambient, and depositing said hydrogen-containing silicon dioxide layer in said adjusted process ambient, said hydrogen containing silicon dioxide layer comprising hydrogen from said additional hydrogen source.

24. A semiconductor device, comprising:
a gate electrode structure comprising a sidewall spacer element formed of a silicon dioxide double liner, said silicon dioxide double liner comprising a first liner formed of an undoped silicon dioxide material and a second liner formed on said first liner of a hydrogen-containing silicon dioxide material, wherein a hydrogen content of said hydrogen-containing silicon dioxide material of said second liner is greater than approximately 1.0 atomic percent and less than approximately 5.0 atomic percent and a hydrogen content of said undoped silicon dioxide material of said first liner is less than approximately 0.5 atomic percent.

25. The semiconductor device of claim 24, wherein said gate electrode structure further comprises a high-k dielectric material formed in a gate insulation layer and a conductive metal-containing electrode material formed on said gate insulation layer.

26. The method of claim 7, wherein said hydrogen-containing silicon dioxide layer is deposited having a second sidewall thickness portion adjacent to said sidewalls that is less than a second top portion thickness portion of said hydrogen-containing silicon dioxide layer deposited above said top surfaces.

27. The method of claim 26, wherein said silicon dioxide cover layer is formed above a first quantity of said plurality of circuit features having a first feature density and above a second quantity of said plurality of circuit features having a second feature density that is less than said first feature density.

28. The method of claim 27, wherein a combined thickness of said undoped and said hydrogen-containing silicon dioxide layers above said top surfaces of said first quantity of said plurality of circuit features having said first feature density is substantially the same as a combined thickness of said undoped and said hydrogen-containing silicon dioxide layers above said top surfaces of said second quantity of said plurality of circuit features having said second feature density.

29. The method of claim 27, wherein a combined thickness of said undoped and said hydrogen-containing silicon dioxide layers adjacent to said sidewall surfaces of said first quantity of said plurality of circuit features having said first feature density is substantially the same as a combined thickness of said undoped and said hydrogen-containing silicon dioxide layers adjacent to said sidewall surfaces of said second quantity of said plurality of circuit features having said second feature density.

30. The semiconductor device of claim 24, wherein the hydrogen content of said hydrogen-containing silicon dioxide material of said second liner is less than approximately 5.0 atomic percent.

* * * * *